United States Patent
Chou

(10) Patent No.: US 6,745,463 B1
(45) Date of Patent: Jun. 8, 2004

(54) MANUFACTURING METHOD OF RIGID FLEXIBLE PRINTED CIRCUIT BOARD

(75) Inventor: Cheng-Hsien Chou, Tu-Cheng (TW)

(73) Assignee: Unitech Printed Circuit Board Corp., Tu-Cheng (TW)

(*) Notice: Subject to any disclaimer, the term of this patent is extended or adjusted under 35 U.S.C. 154(b) by 0 days.

(21) Appl. No.: 09/694,822

(22) Filed: Oct. 24, 2000

(51) Int. Cl.[7] .................................................. H01K 3/10
(52) U.S. Cl. ........................... 29/852; 29/846; 29/847; 427/97; 427/99
(58) Field of Search ........................ 29/846, 847, 852; 427/97, 99

(56) References Cited

U.S. PATENT DOCUMENTS

| | | | |
|---|---|---|---|
| 3,546,775 A | * 12/1970 | Lalmond et al. | ............... 29/830 |
| 5,004,639 A | * 4/1991 | Desai | .......................... 428/138 |
| 5,095,628 A | * 3/1992 | McKenney et al. | ........... 29/846 |
| 5,144,742 A | * 9/1992 | Lucas et al. | .................... 29/830 |
| 5,206,463 A | * 4/1993 | DeMaso et al. | ............. 174/254 |
| 5,419,038 A | * 5/1995 | Wang et al. | ................... 29/830 |
| 5,962,917 A | * 10/1999 | Moriyama | ................... 257/678 |
| 6,236,572 B1 | * 5/2001 | Teshome et al. | ............ 174/261 |

* cited by examiner

*Primary Examiner*—Richard Chang
(74) *Attorney, Agent, or Firm*—Dennison, Schultz, Dougherty & MacDonald

(57) ABSTRACT

The present invention relates to a manufacturing method of rigid flexible printed circuit board. Inner layer circuit are etched on two side of a flexible basefilm and a flat cable for connecting the inner layer circuit on lateral sides is disposed on the middle part thereof. Then layer of outer copper foil without bondfilm made of reinforced fiber on the bottom side thereof is laminated on both sides of the flexible basefilm respectively and drilled a number of through holes on connecting points of preset circuitry thereof. Subsequently, each through hole is metalized and plated for electrically connecting outer copper foil and inner layer circuit on flexible basefilm by means of such plated layer. The copper foil on the top of the flat cable that is on the middle of the flexible basefilm is removed and out layer circuit is made on outer copper foil. At last, the outer layer circuit is covered by solder resist mask. In accordance with the fabricating process mentioned above, the cutting of redundant parts and the trouble of covering protective barrier on flat cable on the middle of the flexible basefilm could be avoided.

1 Claim, 10 Drawing Sheets

US 6,745,463 B1

MANUFACTURING METHOD OF RIGID FLEXIBLE PRINTED CIRCUIT BOARD

BACKGROUND OF THE INVENTION

1. Field of the Invention

The present invention relates to a manufacturing method of rigid flexible printed circuit board, more particularly to a manufacturing method of a multi-layer flexible circuit that can be bent to different angles without the need of cutting needless parts and covering the protective barrier on flat cable positioned on the middle of the flexible basefilm.

2. Description of the Prior Art

Single-sided circuits are the mostly broadly used and the simplest circuits. However, the design of electric circuits is getting so complicated that the area of circuit board is too large for practice by single-sided circuit. Accordingly multi-layer circuits are created for replacing single-sided circuits and the circuits are also shaped in multi-planar configurations. The size of circuit board is reduced for the application of complicated circuits.

A lot of electric apparatus such as palm computers, mobile phones etc is folded for saving storage space so that the circuit boards on different shells must be connected with others and able to be folded. The conventional circuit board is a flexible circuited board with rigid outer layer circuit boards on two lateral sides so as to be folded at the flexible portion on the middle part.

The fabricating process of conventional multi-layer circuits is shown in FIG. 8. Inner layer circuit (a1) is made on two lateral sides of both sides of the flexible basefilm (a) which is clad with copper foil on top and bottom sides. And flat cable (a2) for connection is disposed between the two parts of inner layer circuit (a1).

Afterwards, a dielectric bondfilm (b) with reinforced fiber is laminated on the inner layer circuit (a1) on both sides of the flexible basefilm (a) respectively. The dielectric bondfilm (b) is provided with a rectangular hole (b1) so that the flat cable (a2) on the middle of the flexible basefilm (a) is exposed without covering when the dielectric bondfilm (b) is coated on the flexible basefilm (a). Then an outer copper foil (c) with an insulating layer (c1) thereof is stacked on the top of the inner layer circuit (a1). The outer copper foil (c) also has a rectangular hole (c2) with the same function as the previous one (b1). A number of through holes (d) are drilled on connecting points of preset circuit on the outer copper foil (c), as shown in FIG. 9. After being metalized and plated, the plated layer (e) of these through holes is used for electrical conductivity from the outer copper foil (c) to inner layer circuit (a1). Outer layer circuit (a1) is shaped on the outer copper foil (c) and then is covered by solder resist mask (f). At last, the needless sides (g) on two lateral of the dielectric bondfilm (b) and the outer copper foil (c), as shown in FIG. 10, are sectioned and throw away, thus the multi-layer circuits are produced.

During the fabricating process of conventional multi-layer circuits, the dielectric bondfilm (b) must be provided with a rectangular hole (b1) prior to being manicated to other layer, so as the outer copper foil (c). And the the needless sides (g) also need to be cut out. These inconvenience and trouble during the process will increase the manufacturing cost. In addition, the lamination of the dielectric bondfilm (b) and the outer copper foil (c) onto the flexible basefilm (a) must be quite precise that is not easy to achieve during the manufacturing process. The flat cable (a2) on the middle of the flexible basefilm (a) need to be coated with a layer of protective barrier (f1) while the flat cable (a2) and the adjacent outer copper foil (c) are in different layer so that not all surface of the flat cable (a2) can be coated by the protective barrier (f1). Thus the manufacturing process is getting more difficult.

SUMMARY OF THE INVENTION

It is therefore a primary object of the present invention to provide a foldable multi-layer circuit board that the outer copper foil with bondfilm on the bottom thereof that doesn't include reinforced fiber is directly laminated so that the cutout of redundant parts of the laminate and the inconvenience of localization can be avoided.

A further object of the present invention is to provide a foldable multi-layer circuit board that the outer copper foil with bondfilm, which doesn't include reinforced fiber, on the bottom is directly laminated to the laminate and the outer copper foil on the top of the flat cable is removed at the same time as being made outer layer circuit. Hence it is not necessary to cover a layer of protective barrier on the flat cable on the middle of the flexible basefilm.

BRIEF DESCRIPTION OF THE DRAWINGS

The accomplishment of the above-mentioned object of the present invention will become apparent from the following description and its accompanying drawings which disclose illustrative an embodiment of the present invention, and are as follows.

DETAILED DESCRIPTION OF THE PREFERRED EMBODIMENT

Figure 1:
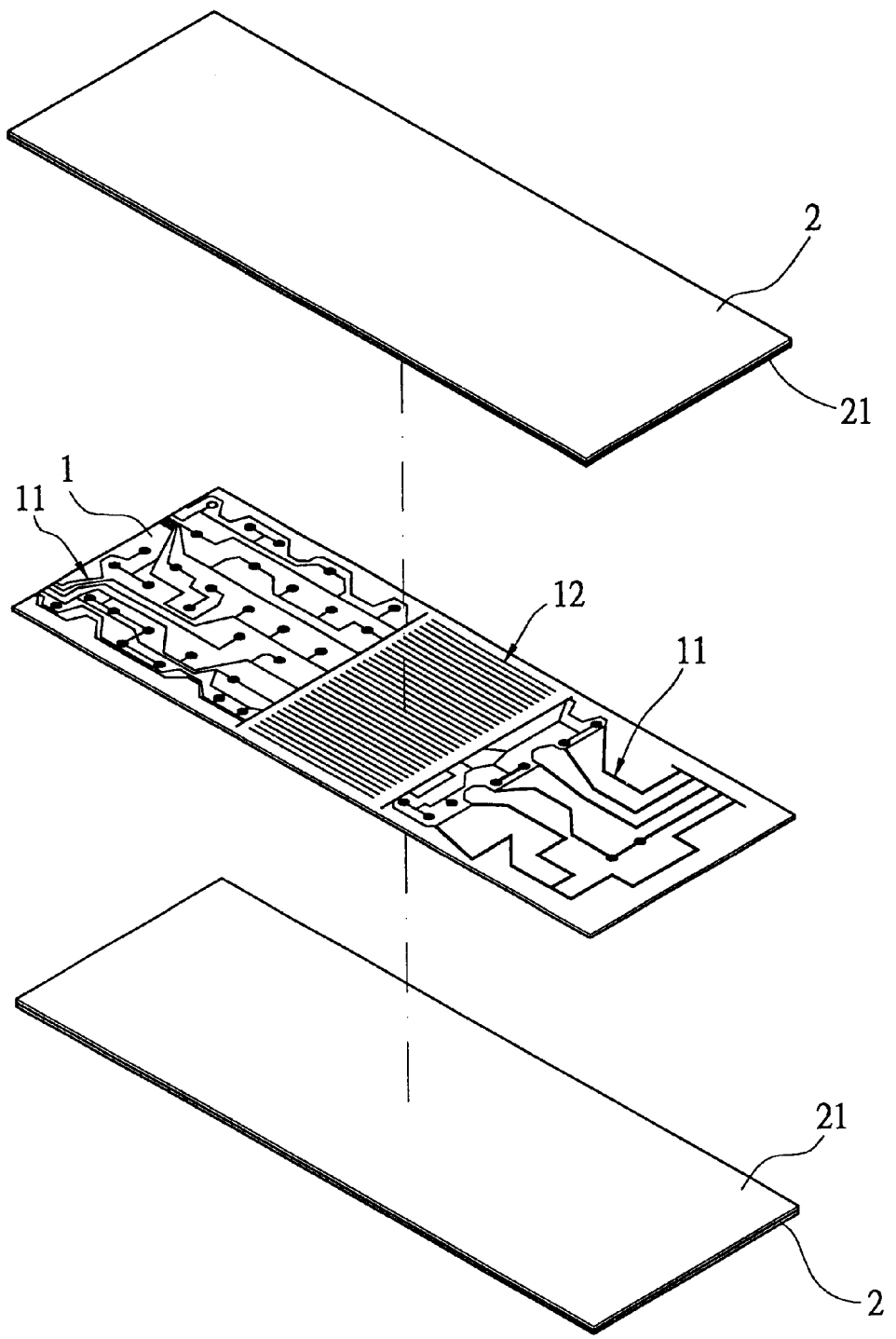
FIG. 1 shows an explosive view of the present invention.
Figure 2:
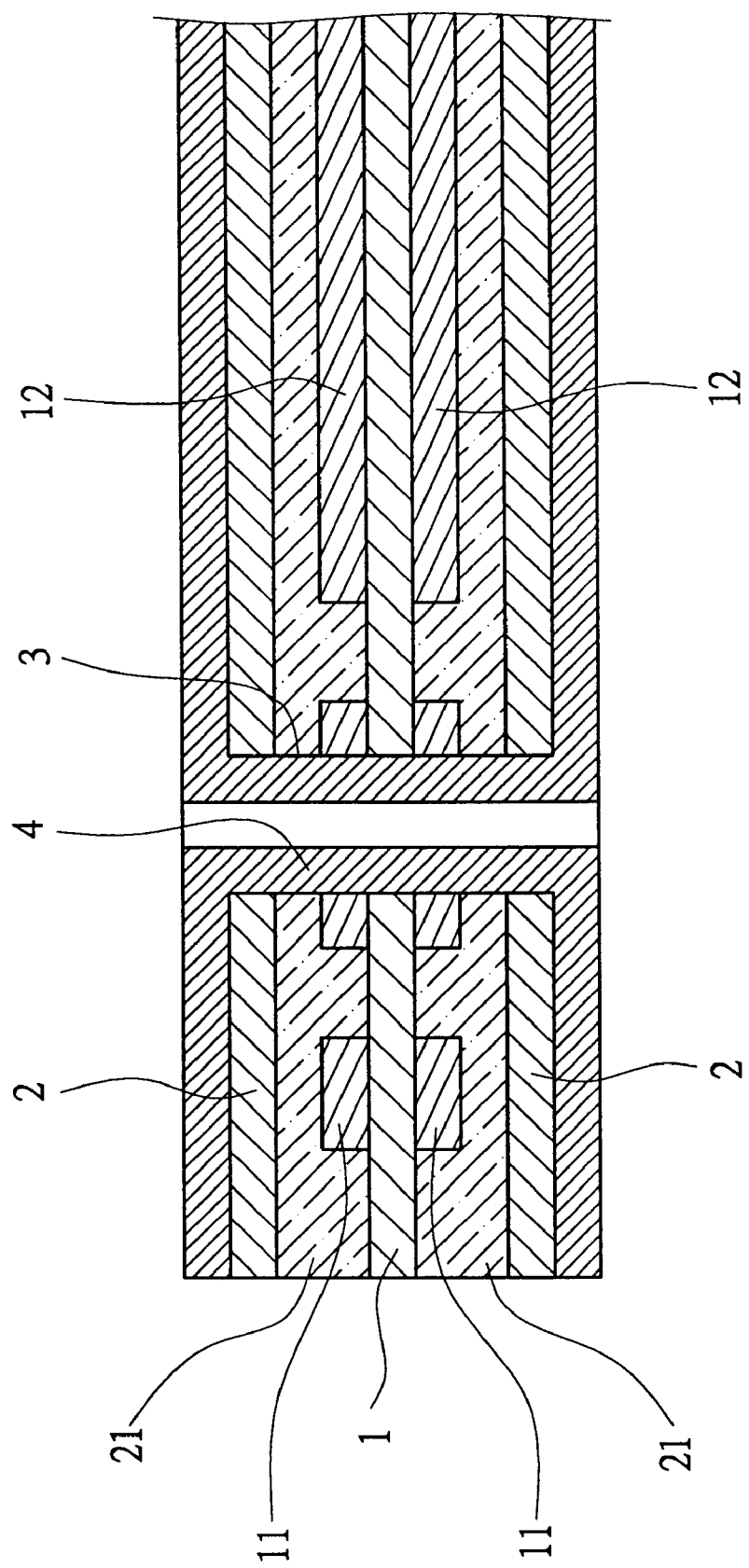
FIG. 2 is a sectional view of the schematic diagram of the present invention showing the plated through holes.
Figure 3:
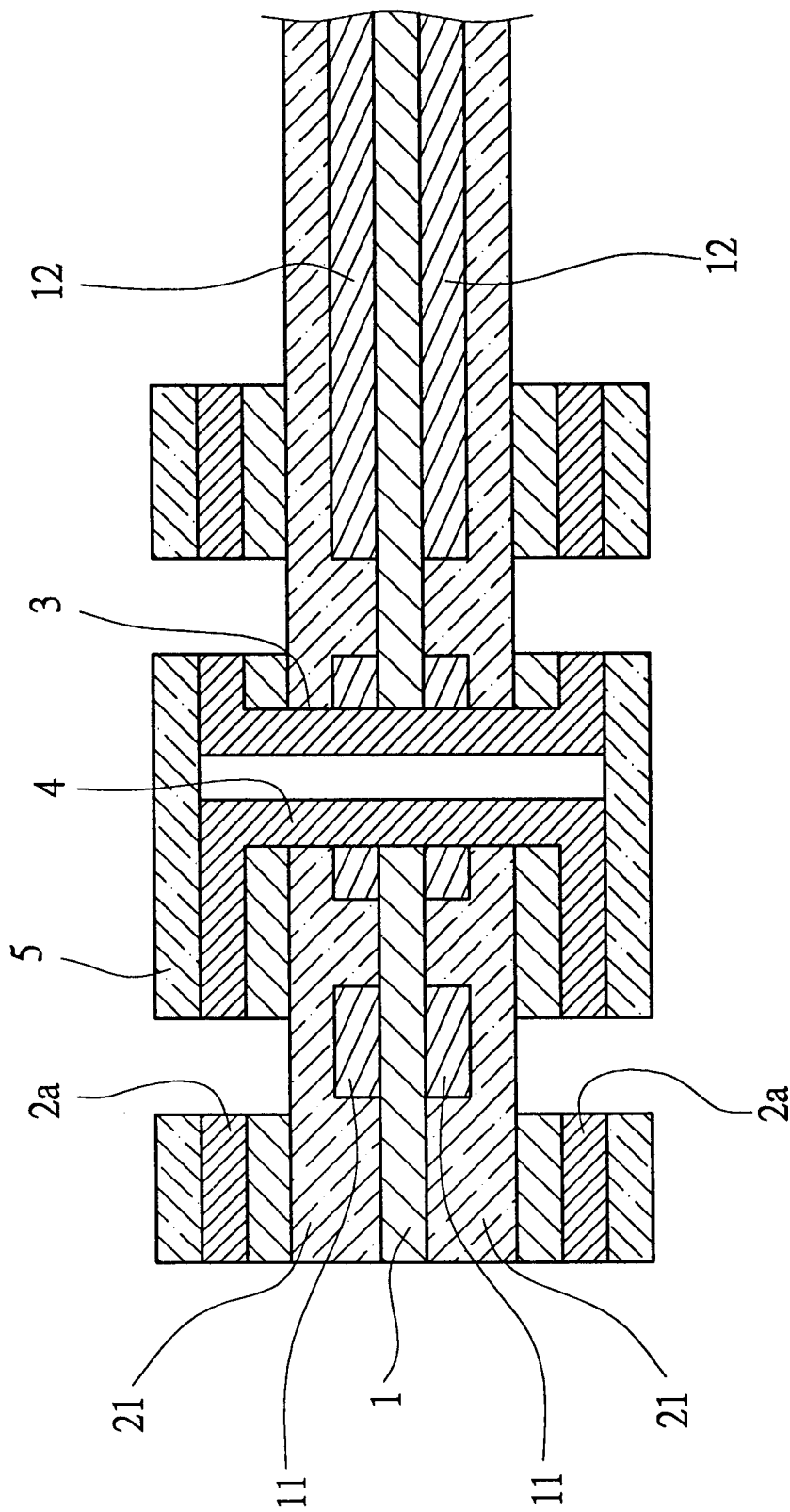
FIG. 3 is a sectional view of the schematic diagram of the present invention showing the end product.

First of all, referring to FIG. 1, the present invention comprising the following steps:

(a) producing inner layer circuit 11 on both sides of a flexible basefilm 1 that is clad both sides with copper foil and a flat cable 12 is disposed between said inner layer circuit 11 on lateral sides thereof;

(b) laminating an outer copper foil 2 with bondfilm 21, which doesn't include reinforced fiber, on the bottom thereof onto both sides of said flexible basefilm 1;

(c) drilling a number of through holes 3 on said outer copper foil 2 at the location of connecting points of preset circuits;

(d) metalizing and plating said through holes 3 so as to electrically connect said outer copper foil 2 with said inner layer circuit 11 on said flexible basefilm 1 by means of a plated layer 4 on said through holes 3;

(e) producing outer layer circuit 2a on said outer copper foil 2 and removing part of said copper foil 2 on the top of said flat cable 12 that is positioned on the middle of said flexible basefilm 1;

(f) covering a layer of solder resist mask 5 on said outer layer circuit 2a;

In accordance with the manufacturing method mentioned above, the trouble and inconvenience raised by cutout of redundant parts, drilling through holes 3, and localization of layers can be avoided due to the direct lamination between the flexible basefilm 1 and the outer copper foil 2 with bondfilm 21. Through the simplification of the fabricating process, the manufacturing cost can be down so as to increase the competitiveness of products.

Furthermore, due to the direct lamination between the flexible basefilm 1 and the outer copper foil 2 with bondfilm 21, the flat cable 12 on the middle of the flexible basefilm 1 is also covered without extra coating step by which the cost is also reduced.

Figure 4:
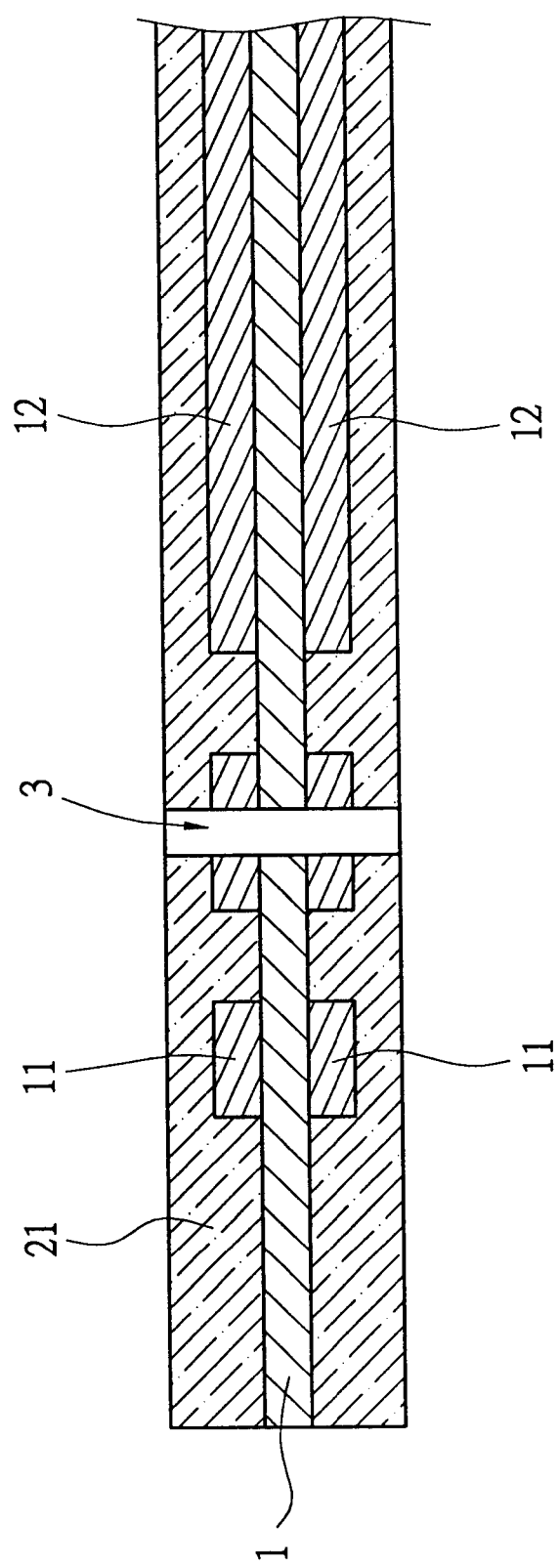
FIG. 4 is a sectional view of the schematic diagram of another embodiment of the present invention showing the drilled through hole.
Figure 5:
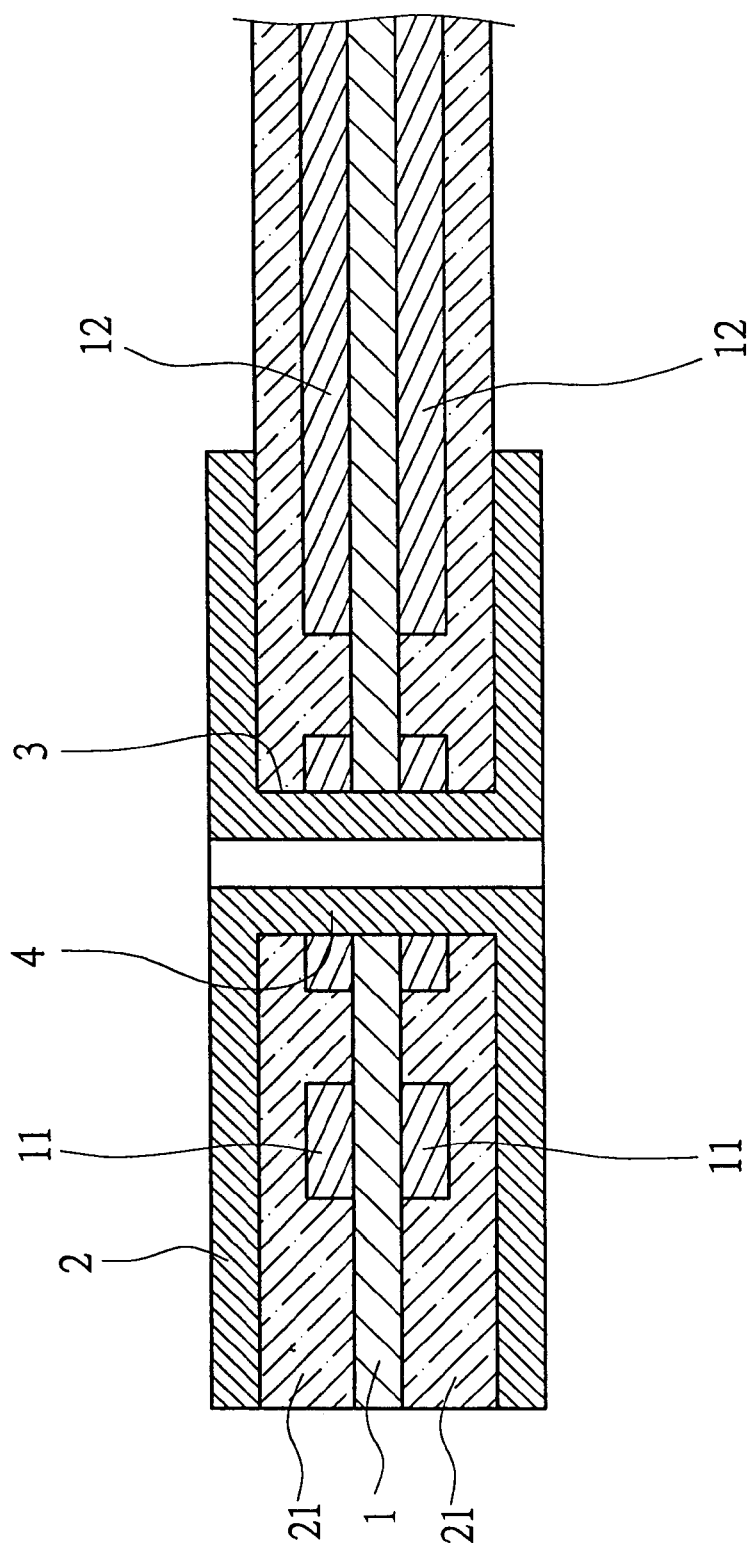
FIG. 5 is a sectional view of the schematic diagram of another embodiment of the present invention showing the plated through hole.
Figure 6:
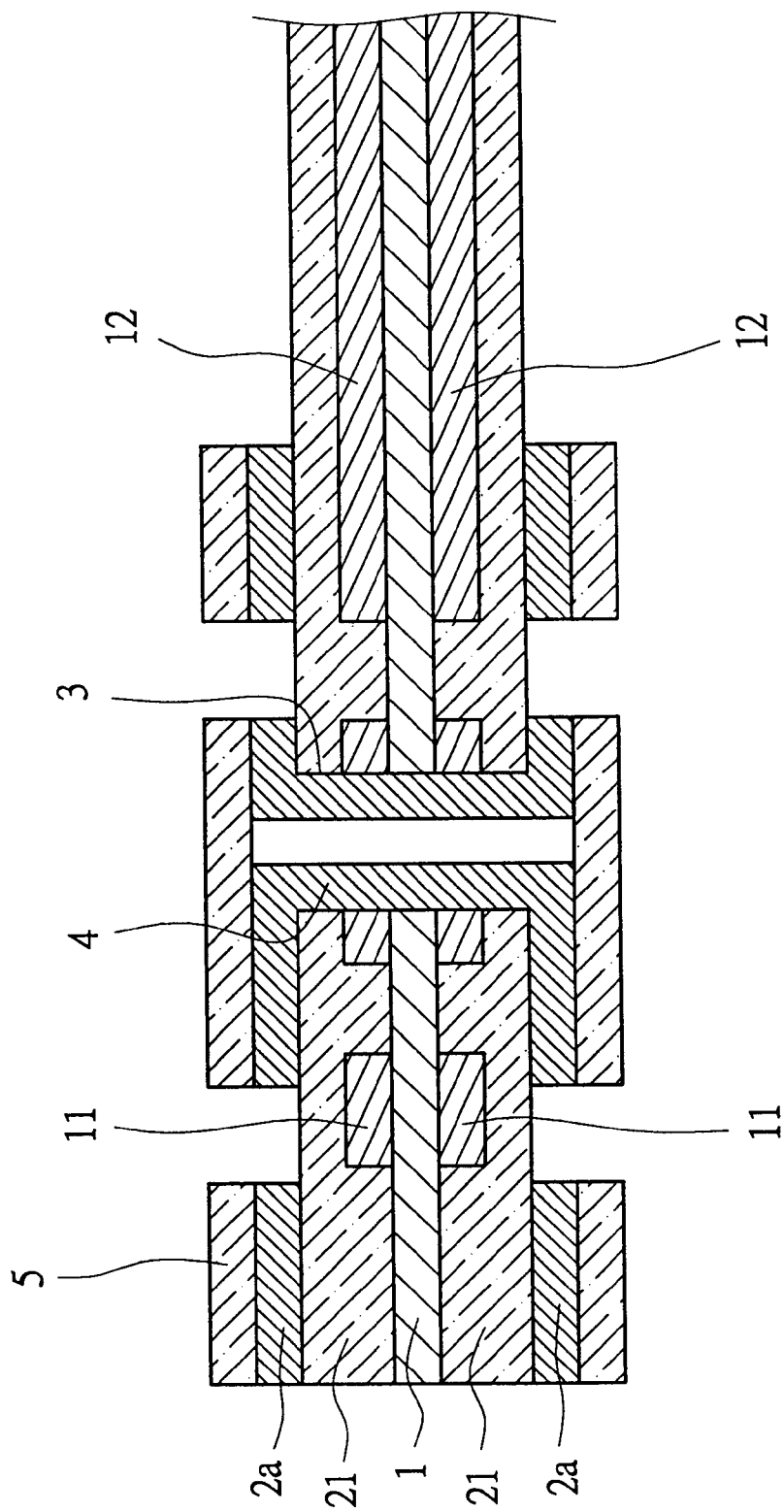
FIG. 6 is a sectional view of the schematic diagram of another embodiment of the present invention showing the end product.

With reference of FIG. 4 & FIG. 5, a bondfilm 21 without reinforced fiber thereof is laminated onto both sides of the flexible basefilm 1 respectively. Then drill through holes 3 on bondfilm 21 at the position of connecting points of preset circuits. After the through holes 3 being metalized and plated, an outer copper foil 2 is formed on the surface of the bondfilm 21. Electrical conductivity from outer copper foil 2 to the inner layer circuit 11, on the flexible basefilm 1, is achieved by plated layer 4 on the through holes 3. Afterwards, the same with above-mentioned procedure, outer layer circuit 2a is made on the outer copper foil 2 and is coated by solder resist mask 5, as shown in FIG. 6. This is another embodiment of the present invention.

Figure 7:
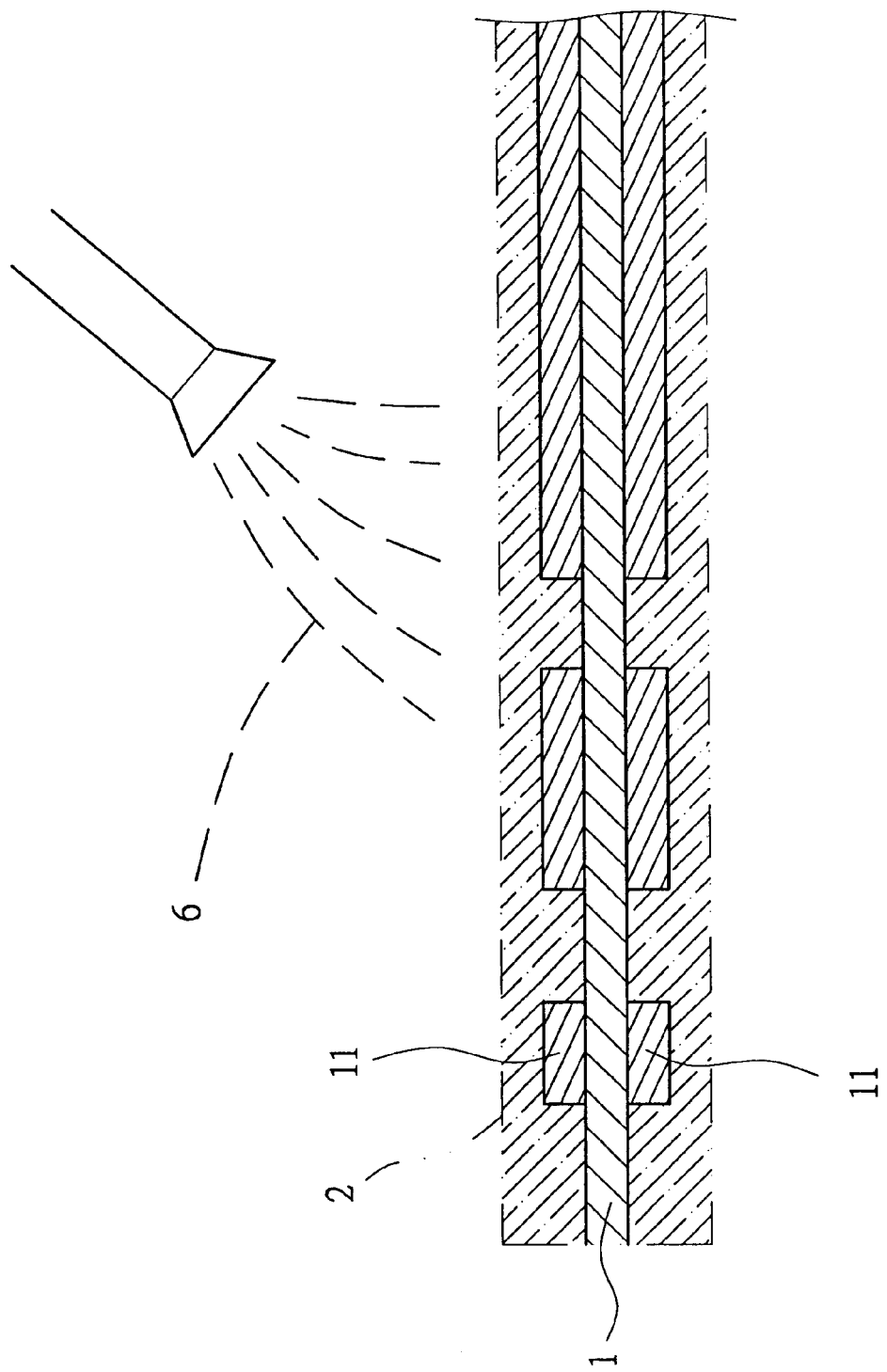
FIG. 7 is a sectional view of the schematic diagram of a further embodiment of the present invention.
Figure 8:
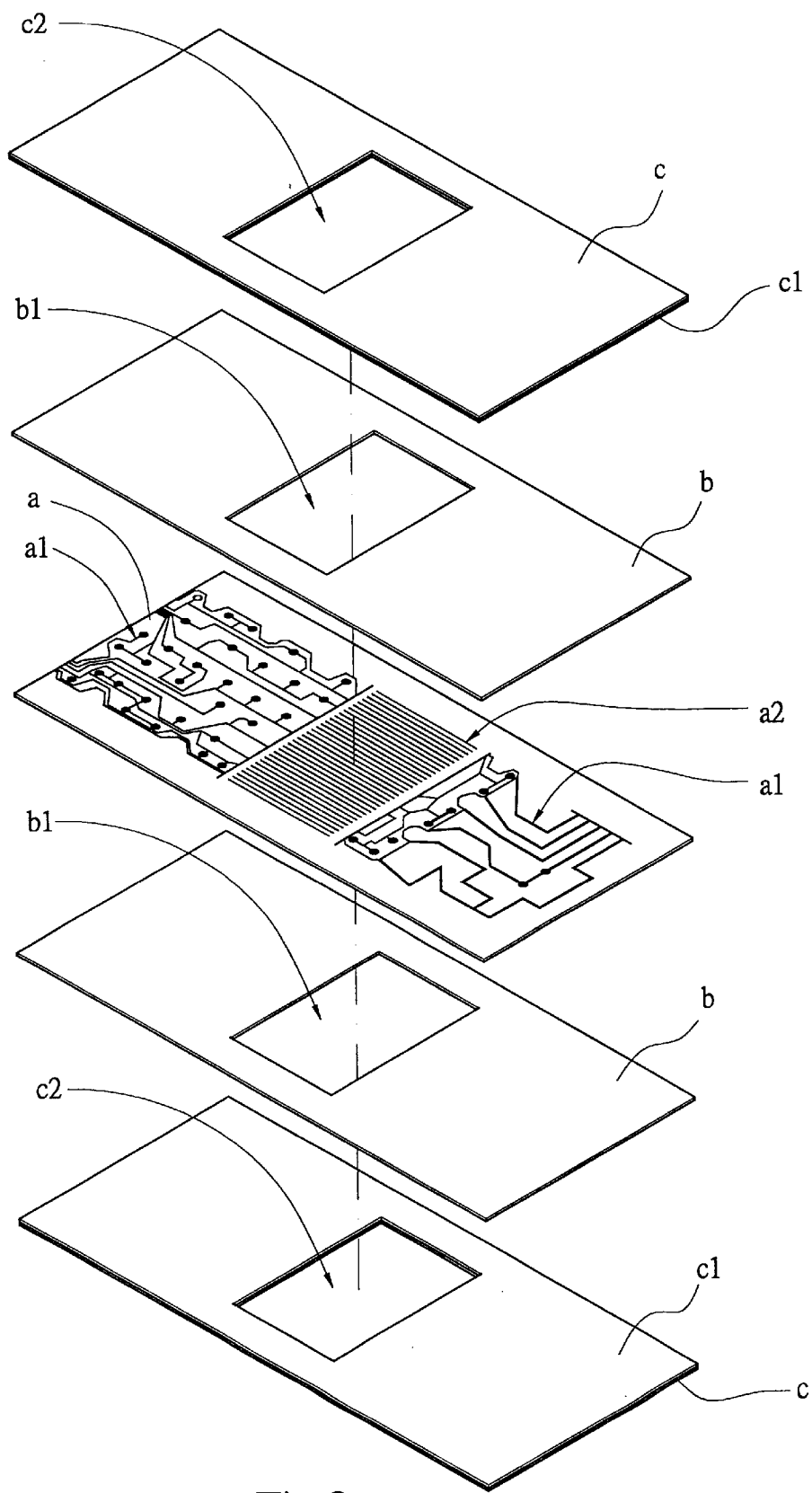
FIG. 8 is an explosive view of prior art.
Figure 9:
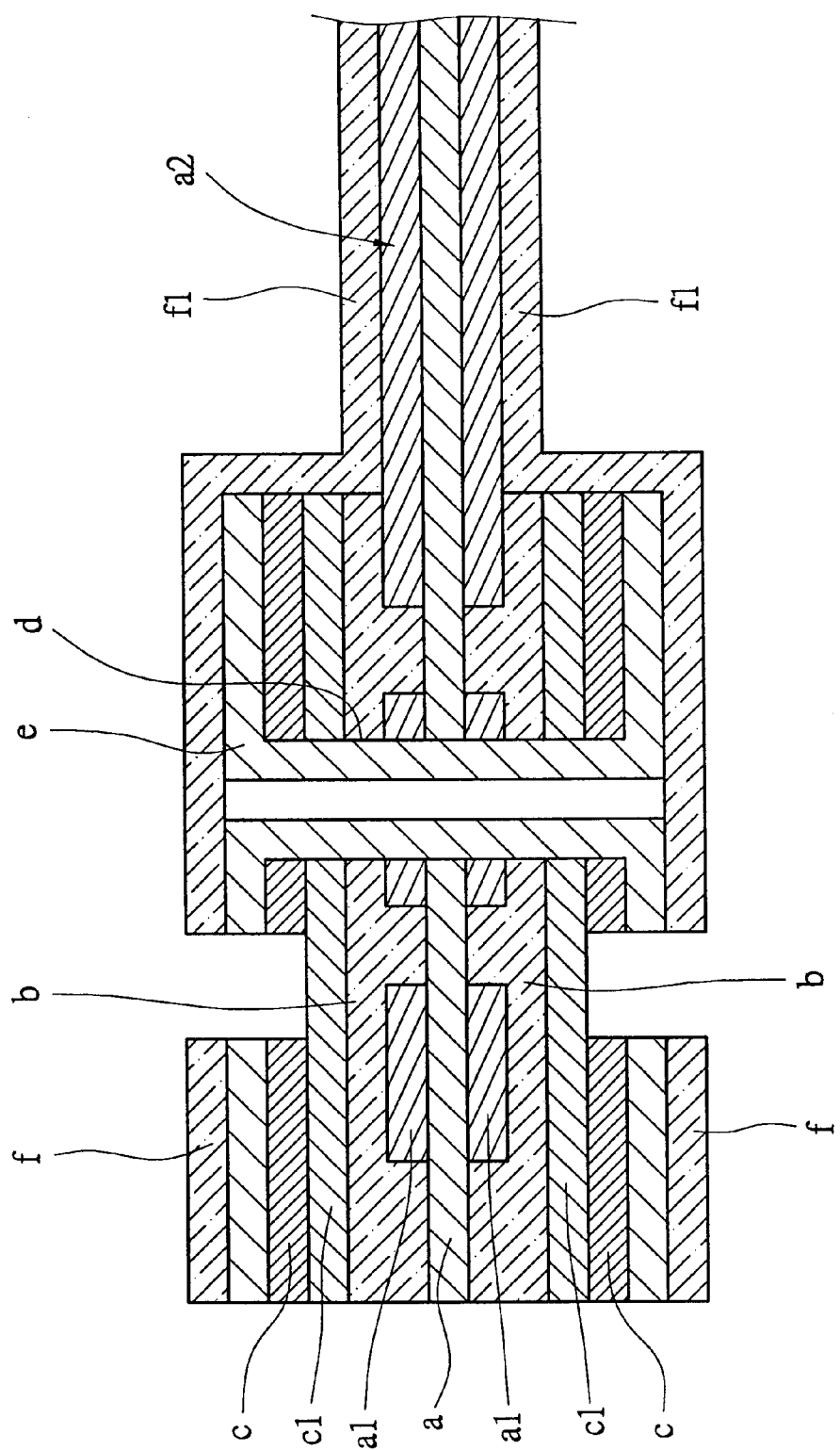
FIG. 9 is a sectional view of the schematic diagram of prior art.
Figure 10:
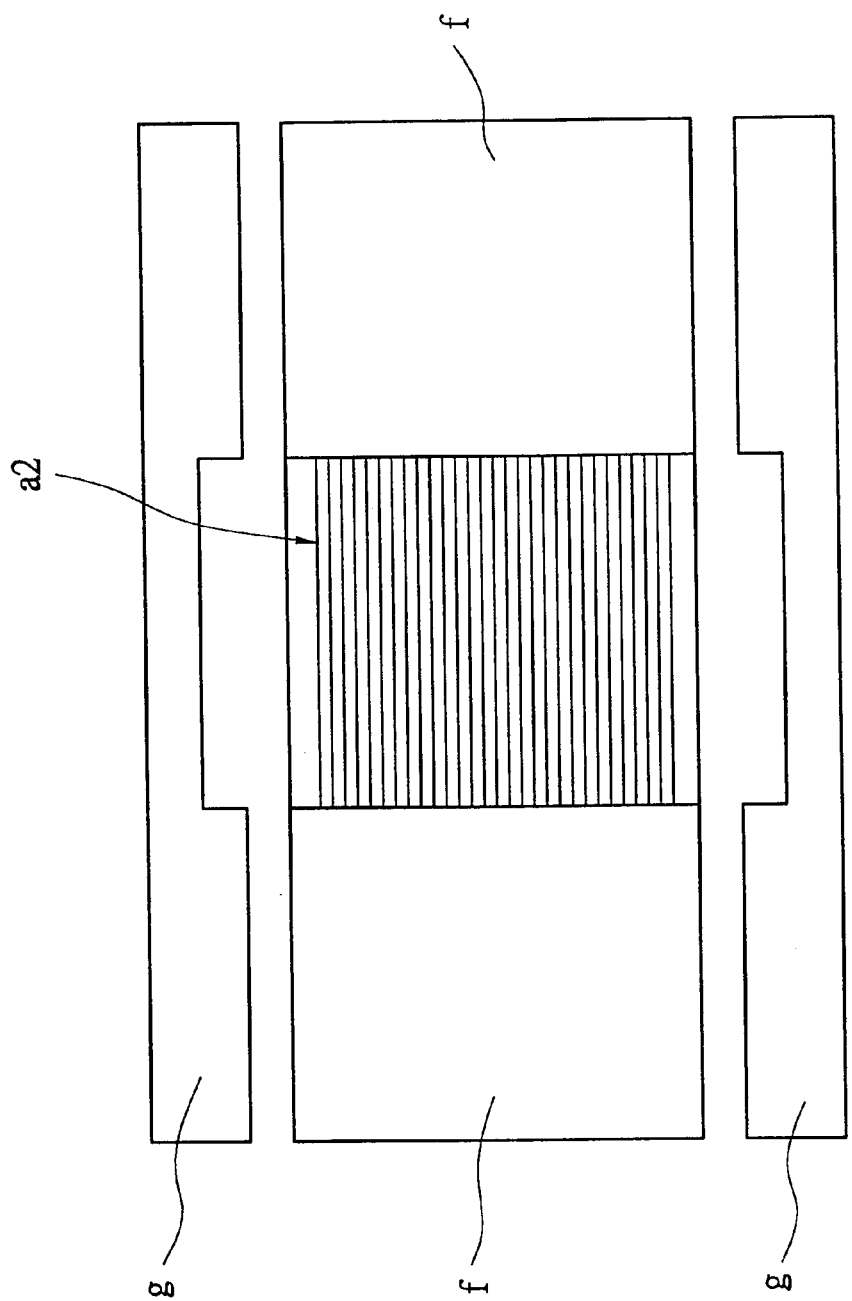
FIG. 10 is a top view of the prior art when cutting out redundant parts.

Referring to FIG. 7, a layer of liquid film substance 6 is coated on both sides of the flexible basefilm 1. The liquid film substance 6 becomes solid bondfilm 21 after cured. Then following the same procedure aforementioned, a number of through holes 3 are drilled on the bondfilm 21. After the through holes 3 being metalized and plated, an outer copper foil is formed on the surface of the bondfilm 21. And the electrical connections between plated layer 4 on the through holes 3 and the inner layer circuit 11 on the flexible basefilm 1 is achieved. Thereafter, outer layer circuit 2a is made on the outer copper foil 2 and is coated by solder resist mask 5, as shown in FIG. 5 & 6.

This is a further embodiment of the present invention.

It is apparent that although the invention has been described in connection with the preferred embodiments, it is contemplated that those skilled in the art may make changes to the preferred embodiments without departing from the scope of the inventions as defined in the appended claims.

What is claimed is:

1. A manufacturing method for a foldable rigid and flexible printed circuit board comprising the steps of:

(a) providing a flexible base film having top and bottom sides and two lateral sides and producing an inner layer circuit on each of said two lateral sides of the flexible base film to form two inner layer circuits with a flat cable disposed between the two inner layer circuits;

(b) laminating an outer copper foil which has a bond film without reinforced fibers on one side of the copper foil onto both top and bottom sides of the flexible base film over the two inner layer circuits and the flat cable disposed between the two inner layer circuits;

(c) drilling a number of through-holes on said outer copper foil at the location of connecting points of preset circuits;

(d) metalizing and plating the through-holes so as to electrically connect the outer copper foil with the inner layer circuit on the flexible base film by means of a plated layer on the through holes;

(e) producing an outer layer circuit on the outer copper foil and removing part of the copper foil on the top of the flat cable that is positioned in the middle of the flexible base film; and (f) covering the outer layer circuit with a layer of solder resist masks.

* * * * *